United States Patent [19]

Davis et al.

[11] Patent Number: 5,064,326
[45] Date of Patent: Nov. 12, 1991

[54] TAMPER PROOF SERVICE BOLT

[76] Inventors: Robert E. Davis, 4281 Linda La.;
Frank R. England, 4819 Old
Mooringsport Rd., both of
Shreveport, La. 71107

[21] Appl. No.: 533,173
[22] Filed: Jun. 4, 1990
[51] Int. Cl.$^5$ .................... F16B 21/18; F16B 33/00
[52] U.S. Cl. .................................. 411/368; 411/5;
411/353; 411/374; 411/910; 292/327
[58] Field of Search ........................ 411/3-5,
411/352, 353, 368, 369, 372, 373, 429, 431, 910,
911, 374; 292/327, 251

[56] References Cited

U.S. PATENT DOCUMENTS

| | | | |
|---|---|---|---|
| 2,033,371 | 3/1936 | Benaggio | 292/327 |
| 2,108,316 | 2/1938 | Love | 411/353 |
| 3,951,443 | 4/1976 | Barnaby | 292/327 |
| 4,037,515 | 7/1977 | Kesselman | 411/910 |
| 4,225,165 | 9/1980 | Kesselman | 411/910 |
| 4,521,146 | 6/1985 | Wharton | 411/910 |
| 4,621,230 | 11/1986 | Crouch et al. | 411/910 |
| 4,668,143 | 5/1987 | Rotar | 411/429 |
| 4,786,224 | 11/1988 | Wharton | 411/911 |
| 4,802,700 | 2/1989 | Stevenson et al. | 411/353 |

FOREIGN PATENT DOCUMENTS

| | | | |
|---|---|---|---|
| 2727949 | 1/1978 | Fed. Rep. of Germany | 411/910 |
| 2210124 | 6/1989 | United Kingdom | 411/910 |

*Primary Examiner*—Neill R. Wilson
*Attorney, Agent, or Firm*—John M. Harrison

[57] ABSTRACT

Tamper proof service bolts for sealing boxcars, automobile hoods, gates and other enclosures, as well as gas and electric meters, railroad switches and the like. In a first preferred embodiment the tamper proof service bolts are characterized by special head service bolts, each having a base member and a collar secured to the base member by means of a connecting bolt having a specialized head recess for receiving a corresponding tool which is required for removing the connecting bolt and the collar from the base member. In another preferred embodiment of the invention retainer clip service bolts are provided, wherein a retainer clip is adapted to mount on each base member and in the collar when the collar is fitted over the base member, to secure the collar on the base member. In still another preferred embodiment a sacrifice head service bolt is provided where the collar is fitted on the base member and a sacrifice head having a thin, frangible neck is threaded on the base member, such that the bottom element of the sacrifice head is countersunk in the collar when the top element of the sacrifice head is stripped from the bottom element at the frangible neck. A cross-thread nipple service bolt is also provided, wherein the base member is fitted with an upward-standing, threaded stud for engaging dissimilar threads in a cross-thread collar such that the threaded nipple is irreversibly cross-threaded into the cross-thread collar.

8 Claims, 2 Drawing Sheets

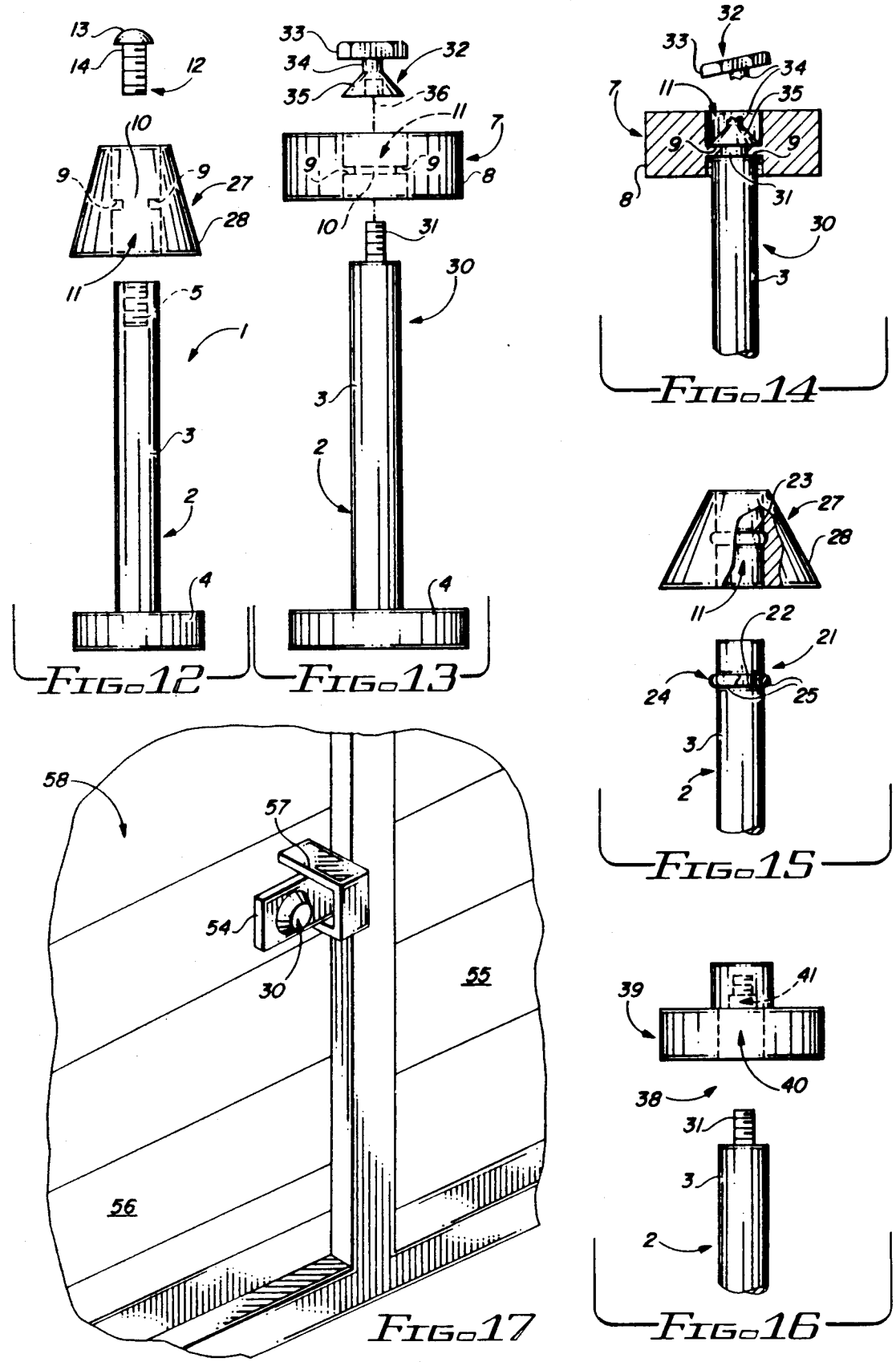

TAMPER PROOF SERVICE BOLT

BACKGROUND OF THE INVENTION

1. Field of the Invention

This invention relates to tamper proof locks and fittings and more particularly, to tamper proof service bolts which are designed to be used in such tamper sensitive closure services as sealing railroad switches, gas and electric meters and the like, as well as railroad boxcars, automobile hoods, gates and doors, in non-exclusive particular. In a first preferred embodiment, special head service bolts are provided, each of which includes a base member having a head on one end, a collar of selected shape fitted over the opposite end of the base member and a connecting bolt extending through the cylindrical collar and threadably seated in the base member for securing the cylindrical collar to the base member. A specially designed head recess provided in each connecting bolt requires a corresponding specially designed tool to remove the connecting bolt and the collar from the base member. In a second preferred embodiment of the invention retainer clip service bolts are provided, wherein each collar is attached to a corresponding base member by means of a retainer clip, such that removal of the collar from the base member cannot be effected without destroying the retainer clip service bolts. A sacrifice head service bolt is also provided where the collar is fitted on the base member and a sacrifice head having a thin, frangible neck is threaded on the base member, the bottom element of the sacrifice head being countersunk in the collar when the top element of the sacrifice head is stripped from the bottom element at the frangible neck. In another preferred embodiment of the invention a cross-thread nipple service bolt is provided, wherein a threaded nipple extends from one end of the base member and a cross-thread collar having an internally threaded seat is designed to receive the threaded nipple, such that the threaded nipple irreversibly cross-threads in the dissimilarly-threaded cross-thread seat, upon rotation of the cross-thread collar with respect to the base member. Like the retainer clip service bolts, removal of the cross-thread collar from the base member cannnot be effected without cutting the base member or collar or otherwise destroying the cross-thread nipple service bolt.

Security of various enclosures and tamper proof service bolt applications, including closures for warehouses, railroad boxcars, fences and even the engine compartments of automobiles and gas and electric meters, in non-exclusive particular, has become an ever increasing problem. Conventional locks such as padlocks and the like are of limited value in many instances, because of the variety of keys which must sometimes be distributed to various employees and others to gain entrance to the enclosures. Furthermore, padlocks are also easily cut with bolt cutters and other tools and therefore offer limited protection to the enclosure contents. Moreover, certain security applications, such as gas and electric meters require special closures which must be destroyed to provide the necessary access.

Accordingly, it is an object of this invention to provide tamper proof service bolts for application to the gate or door of an enclosure, or on a switch or the like, to prevent the unauthorized entry into the enclosure or operation of the switch.

Another object of this invention is to provide special head service bolts which are each characterized by a base member having a head on one end, a collar which fits over the opposite end of the base member and a connecting bolt designed to engage the collar and threadably engage the base member, which connecting bolt is fitted with a special head recess requiring a corresponding tool for engagement and removal.

Another object of the invention is to provide retainer clip service bolts for securing a closure or the like, which service bolts include a circumferential groove located on a base member having a head on one end, a corresponding groove provided inside a longitudinal bore in the collar and a retainer clip initially fitted to the base member and seated in the corresponding groove located in the collar when the base member is inserted in the collar, to permanently secure the base member to the collar. Removal of the retainer clip service bolt from the closure application requires destruction of the base member or collar.

Still another object of this invention is to provide a sacrifice head service bolt device for securing a closure, switch or the like, which device is characterized by a base member fitted with a head at one end and a threaded nipple on the opposite end, a collar fitted over the threaded nipple and the base member and a sacrifice head threaded onto the threaded nipple, wherein the grip segment of the sacrifice head may be twisted from the threadably secure portion of the sacrifice head to prevent removal of the recessed collar from the base member. Removal of the retainer clip service bolt from the closure requires destruction of the base member or the collar.

A still further object of this invention is to provide an aluminum cross-thread nipple service bolt having a base member provided with a head on one end and a threaded nipple on the opposite end for insertion in a cooperating, dissimilarly-threaded nipple seat located in a cross-thread collar, wherein the threaded nipple is cross-threaded in the cross-thread collar by rotating the collar with respect to the base member. Removal of the cross-thread nipple service bolt from a closure also requires destruction of either the base member or the collar.

2. Summary of the Invention

These and other objects of the invention are provided in tamper proof service bolts which are designed for engagement with the closure fittings or brackets of an enclosure, railroad switch, gas and electric motor or the like, which service bolts either require a special tool for removing a connecting bolt element and separating the collar and base member elements, or destruction of the base member or collar elements to remove the service bolts from the respective fittings.

BRIEF DESCRIPTION OF THE DRAWINGS

The invention will be better understood by reference to the accompanying drawings, wherein:

FIG. 12 is an exploded view of an alternative preferred embodiment of the special head service bolt illustrated in FIGS. 1-7;

FIG. 13 is an exploded view of a sacrifice head service bolt of this invention;

FIG. 14 is a sectional view of the top portion of the sacrifice head service bolt illustrated in FIG. 13, with the collar retained on the base member and the grip portion removed;

FIG. 15 is an exploded view of the top portion of an alternative design of the retainer clip service bolt illustrated in FIG. 8;

FIG. 16 an exploded view of the top portion of a cross-thread nipple service bolt of this invention; and FIG. 17 is a perspective view, partially in section, of a railroad boxcar, illustrating application of the sacrifice head service bolt illustrated in FIG. 14.

DESCRIPTION OF THE PREFERRED EMBODIMENTS

Figure 1:
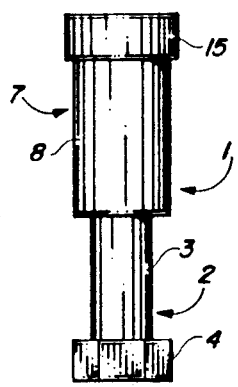
FIG. 1 is a front view of a special head service bolt of this invention.
Figure 2:
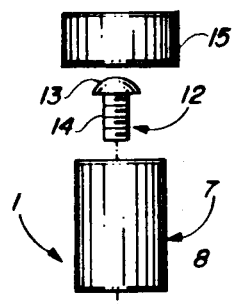
FIG. 2 is an exploded view of the special head service bolt illustrated in FIG. 1.
Figure 9:
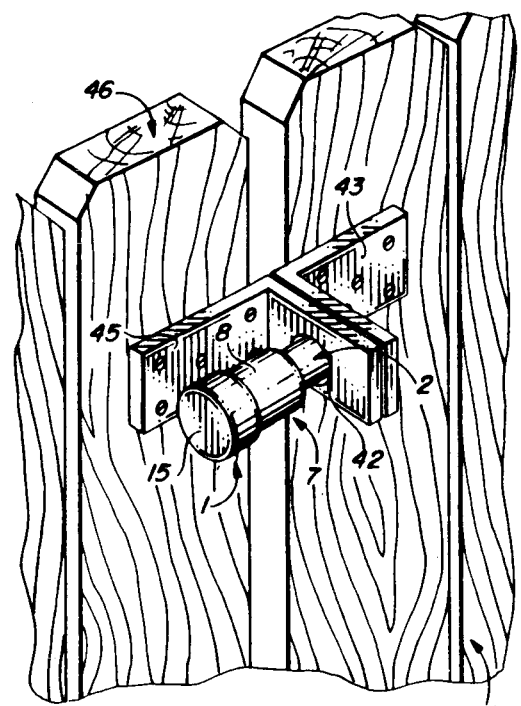
FIG. 9 is a perspective view of a fence flange and gate flange joined by the special head service bolt illustrated in FIGS. 1 and 2.
Figure 5:
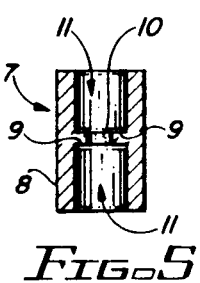
FIG. 5 is a sectional view taken along line 5—5 of the cylindrical collar element illustrated in FIG. 3.
Figure 3:
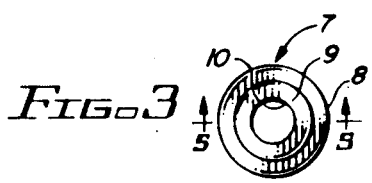
FIG. 3 is a top view of a cylindrical collar element of the special head service bolt illustrated in FIGS. 1 and 2.
Figure 4:
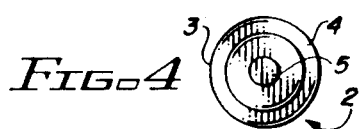
FIG. 4 is a top view of the base member element of the special head service bolt illustrated in FIGS. 1 and 2.
Figures 6, 7:
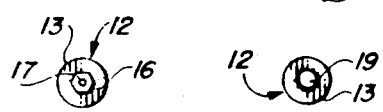
FIG. 6 is a top view of a first preferred connecting bolt element of the special head service bolt illustrated in FIGS. 1 and 2.
FIG. 7 is a top view of a second preferred embodiment of the connecting bolt element of the special head service bolt illustrated in FIGS. 1 and 2.
Figure 11:
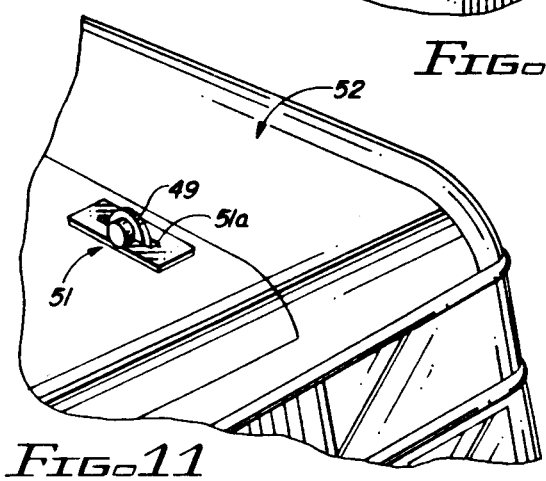
FIG. 11 is a perspective view, partially in section, of an automobile hood retained in locked configuration by operation of the special head service bolt illustrated in FIGS. 1-7.

Referring initially to FIGS. 1-7 and 9 of the drawing, the special head service bolt of this invention is generally illustrated by reference numeral 1. The special head service bolt 1 is characterized by an elongated base member 2 having a cylindrically-shaped base member shank 3, fitted with a base member head 4 at one end. A threaded seat 5 is provided in the opposite end of the base member shank 3, as illustrated in FIG. 4, and a cylindrical collar 7 is characterized by a collar sleeve 8, having a sleeve bore 11, which is designed to accommodate the base member shank 3 of the base member 2. A sleeve flange 9 is located in the approximate center of the sleeve bore 11 and is provided with a flange opening 10, as illustrated in FIGS. 3 and 5. Accordingly, the collar sleeve 8 of the cylindrical collar 7 may be fitted over the projecting end of the base member shank 3 until the sleeve flange 9 contacts the end of the base member shank 3. The threaded shank 14 of the connecting bolt 12 may then be inserted in the top segment of the sleeve bore 11 of the collar sleeve 8 and through the flange opening 10 in the sleeve flange 9, to threadably engage the threaded seat 5 with the threaded shank 14 and seat the bolt head 13 and the end of the base member shank 3 on opposite sides of the sleeve flange 9. The bolt head 13 of the connecting bolt 12 is sufficiently small in diameter to fit inside the sleeve bore 11 and is provided with a hexagonal recess 16 and a projecting tamper tip 17, as illustrated in FIG. 6, or a star recess 19, as illustrated in FIG. 7. As illustrated in FIG. 9, the base member 2 of the special head service bolt 1 is initially inserted through an opening 42, provided in the outwardly-extending elements of the gate flange 43 and the fence flange 45 of the gate 44 and the fence 46, respectively. The collar sleeve 8 is then seated on the base member 2, as illustrated in FIG. 2 and the connecting bolt 12 is inserted in the sleeve bore 11 of the collar sleeve 8 and threaded into the threaded seat 5 of the base member shank 3, using an appropriate tool (not illustrated) which fits the tamper tip 17 or star recess 19, as required. The optional cap 15 may then be inserted over the end of the cylindrical collar 7 to prevent dirt or sediment from settling in the sleeve bore 11 of the collar sleeve 8 and rendering extraction of the connecting bolt 12 from the threaded sleeve 5 difficult when it is desired to remove the special head service bolt 1 from the gate flange 43 and fence flange 45. A similar application of the special head service bolt 1 to lock the hood 51 of an automobile 52 in closed configuration is illustrated in FIG. 11. The base member 2 of the special head service bolt 1 is inserted through a staple 49, projecting through a hood slot 51a in the hood 51, to secure the hood 51.

Figure 8:
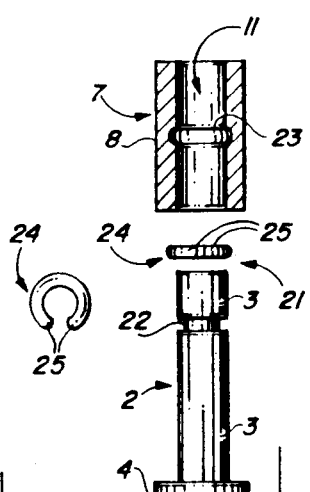
FIG. 8 is an exploded view of a retainer clip service bolt of this invention.
Figure 10:
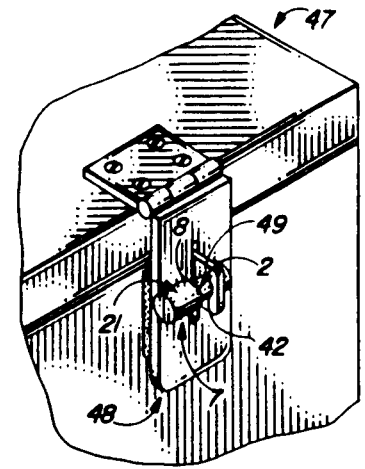
FIG. 10 is a perspective view, partially in section, of a box fitted with a hasp and staple, wherein the hasp is secured to the staple by means of a retainer clip service bolt of this invention.

Referring now to FIG. 8 of the drawings, a retainer clip service bolt 21 is illustrated and includes a base member 2, having a base member head 4 provided at one end thereof and a cylindrical collar 7 for fitting over the opposite end of the base member 2. A shank groove 22 is machined in the base member shank 3 of the base member 2 in spaced relationship with respect to the base member head 4 and a corresponding collar groove 23 is provided in the sleeve bore 11 of the collar sleeve 8. A conventional C-shaped retainer clip 24, having facing clip ends 25, is designed for insertion in the shank groove 22 of the base member shank 3 and when the retainer clip 24 is so inserted, the base member shank 3 may be inserted in the sleeve bore 11 of the collar sleeve 8 with the clip ends 25 depressed toward each other, until the retainer clip 24 seats in the collar groove 23, to permanently secure the cylindrical collar 7 on the base member shank 3 of the base member 2. Accordingly, referring now to FIG. 10, the base member 2 is inserted through an opening 42 located in the staple 49, which projects through a slot located in a conventional hasp 48, to close a box 47. The retainer clip 24 is then inserted in the corresponding shank groove 22, located in the base member shank 3, and the cylindrical collar 7 is inserted over the base member shank 3 to engage the retainer clip 24 and the collar groove 23 located in the collar sleeve 8. This action locks the hasp 48 on the staple 49 and secures the box 47 in closed configuration.

Referring now to FIG. 12 of the drawing, an alternative preferred embodiment of the special head service bolt 1 is illustrated, wherein a tapered collar 27 is characterized by a tapered collar sleeve 28, having a sleeve bore 11, a sleeve flange 9 and a flange opening 10, provided in the flange 9, for receiving a base member shank 3, provided with a base member head 4 on one end and a threaded seat 5 on the other end. As in the case of the special head service bolt 1 illustrated in FIGS. 1-7, a connecting bolt 12 extends into the sleeve bore 11 and the threaded shank 14 of the connecting bolt 12 threadably engages the internally-threaded seat 5 of the base member shank 3 to secure the tapered collar 27 on the base member shank 3. Further as in the case of the special head service bolt 1 illustrated in FIGS. 1-7, the bolt head 13 may be fitted with a hexagonal recess 16, having a projecting tamper tip 17, as illustrated in FIG. 12 or a star recess 19, as illustrated in FIG. 7, as well as any alternative desired recess configuration which requires a special tool (not illustrated) having a corresponding mating configuration for installing and removing the connecting bolt 12 to and from the threaded seat 5, respectively.

Referring now to FIGS. 13 and 14 of the drawings, in yet another preferred embodiment of the invention a sacrifice head service bolt 30 is illustrated and includes a base member 2, which includes a cylindrical base member shank 3 having a base member head 4 on one end and a threaded nipple 31 upward-standing from the opposite end thereof. A cylindrical collar 7 is characterized by a collar sleeve 8, having a sleeve bore 11 provided therein, with a sleeve flange 9 located in the approximate center of the sleeve bore 11 and a flange opening 10 centered in the sleeve flange 9. Accordingly, the collar sleeve 8 of the cylindrical collar 7 is designed to fit over the threaded nipple 31, wherein the threaded nipple 31 extends through the flange opening 10. A sacrifice head 32 includes a sacrifice head grip 33, connected to a sacrifice head 35 by a thin, frangible sacrifice head neck 34 and a wedge-shaped threaded base receptacle 36 is designed to receive the threaded nipple 31 and threadably secure the cylindrical collar 7 on the base member 2. Accordingly, as further illustrated in FIGS. 13 and 14, the sacrifice head 32 is threaded on the threaded nipple 31 to seat the sacrifice head base 35 and base member shank 3 against opposite sides of the sleeve flange 9. The sacrifice head grip 33 is then twisted to shear the frangible sacrifice head neck 34 and leave the sacrifice head base 35 in threaded engagement with the threaded nipple 31 and recessed in the sleeve bore 11, such that the cylindrical collar 7 cannot be removed from the base member shank 3. Accordingly, either the cylindrical collar 7 or the base member 2 must be destroyed in order to remove the sacrifice head service bolt 30 from its service location. For example, referring now to FIG. 17, the base member 2 of the sacrifice head service bolt 30 is inserted through an opening (not illustrated) provided in the door plate 54 mounted on a boxcar door 55 of a box car 58, after the boxcar door 55 is closed and the door plate 54 is extended through a corresponding side bracket 57, mounted on the boxcar side 56. The cylindrical collar 7 is then fitted over the base member 2 such that the threaded nipple 31 extends through the flange opening 10 and the sacrifice head 32 is threadably inserted on the extending end of the threaded nipple 31 to secure the cylindrical collar 7 in position. The sacrifice head grip 33 is then further twisted to break the frangible sacrifice head neck 34, as illustrated in FIG. 14, and irreversibly secure the cylindrical collar 7 on the end of the base member shank 3.

Referring now to FIG. 15, an alternative embodiment of the retainer clip service bolt 21 illustrated in FIG. 8 is illustrated, wherein a tapered collar 27, characterized by a tapered collar sleeve 28, provided with a sleeve bore 11, is further fitted with a collar groove 23, while the base member shank 3 of the base member 2 is fitted with a corresponding shank groove 22 for receiving a retainer clip 24. The base member shank 3 is then inserted in the sleeve bore 11 to engage the retainer clip 24 with the collar groove 23 and permanently secure the tapered collar 27 on the base member 2, as heretofore described.

Referring now to FIG. 16 of the drawings, a cross-thread nipple service bolt 38 is illustrated and includes an aluminum base member 2, provided with a head (not illustrated) on one end and a threaded nipple 31 extending from the opposite end thereof. Further included is an aluminum cross-thread collar 39, fitted with a cross-thread collar bore 40 and a cross-thread collar seat 41, located at the base of the cross-thread collar bore 40. The cross-thread collar seat 41 is internally threaded with a selected thread design to receive the nipple 31, which is provided with threads of dissimilar design. Accordingly, tightening of the cross-thread collar 39 on the threaded nipple 31 cross-threads the threaded nipple 31 in the cross-thread collar seat 41 and prevents unthreading of the threaded nipple 31 from the cross-thread seat 41. Typically, the threads located on the threaded nipple 31 are "National Course" threads, while the internal threads provided in the cross-thread collar seat 41 are "National Fine" threads, or vice-versa. Other thread variations which may be used in the cross-thread nipple service bolt 38 application are metric and standard, or English threads, in non-exclusive particular.

It will be appreciated by those skilled in the art that other tamper proof service bolt designs are possible, including the use of a pop rivet to join the collar sleeve 8 of the respective cylindrical collars 7 to the base member shank 3 of the corresponding base member 2, instead of the connecting bolt 12, illustrated in FIGS. 1-7 and 12. The key factor in each of the tamper proof service bolts of this invention is the facility for either removably or permanently attaching a cylindrical collar 7, illustrated in FIGS. 1-3, 8-11, 13, 14 and 17 or a tapered collar 27, illustrated in FIGS. 12 and 15, as well as the cross-thread collar 39, illustrated in FIG. 16, to a base member 2 in a selected service application.

Accordingly, while the preferred embodiments of the invention have been described above, it will be recognized and understood that various modifications may be made in the invention and the appended claims are intended to cover all such modifications which may fall within the spirit and scope of the invention.

Having described my invention with the particularity set forth above, what is claimed is:

1. A tamper proof service bolt comprising a base member having a head on one end and internal threads provided in the opposite end thereof, a collar having an internal collar bore coextensive with the length of said collar for receiving said opposite end of said base member, a flange disposed in said collar bore and a flange opening provided in said flange, said flange opening communicating with said collar bore for limiting the travel of said opposite end of said base member into one end of said collar and a connecting bolt having a tamper proof head and a threaded shank adapted for insertion in the opposite end of said collar bore with said threaded shank engaging said internal threads of said base member and securing said collar on said base member in tamper proof relationship.

2. The tamper proof service bolt of claim 1 wherein said collar is cylindrical.

3. The tamper proof service bolt of claim 1 wherein said collar is tapered.

4. The tamper proof service bolt of claim 1 further comprising a cap provided on said collar.

5. The tamper proof service bolt of claim 4 wherein said collar is cylindrical.

6. The tamper proof service bolt of claim 4 wherein said collar is tapered.

7. A special head tamper-proof service bolt comprising a base member having a head on one end and internal threads provided in the opposite end thereof; a collar having a longitudinal collar bore coextensive with the length of said collar; a flange provided in said collar bore and a flange opening provided in said flange, said flange opening communicating with said collar bore; and a connecting bolt having a threaded shank and a tamper-proof head, said threaded shank adapted for extension into one end of said collar bore through said flange opening and threadably engaging said internal threads provided in said base member when said base member is projected into the opposite end of said collar bore, and securing said connecting bolt and said opposite end of said base member on opposite sides of said flange, responsive to tightening of said connecting bolt.

8. The special head tamper proof service bolt of claim 7 further comprising a cap provided on said collar.

* * * * *